(12) United States Patent
Downes (10) Patent No.: US 6,544,392 B1
(45) Date of Patent: Apr. 8, 2003

(54) APPARATUS FOR MANUFACTURING PCB'S

(75) Inventor: Stuart Douglas Downes, Milford, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 10/117,397

(22) Filed: Apr. 5, 2002

Related U.S. Application Data (62) Division of application No. 09/536,195, filed on Mar. 27, 2000, now Pat. No. 6,398,935.

(51) Int. Cl.[7] .............................. C25B 9/00; C25C 7/00; C25D 17/00
(52) U.S. Cl. ............ 204/242; 204/224 R; 204/DIG. 7; 118/400
(58) Field of Search ...................... 204/224 R, DIG. 7, 204/242; 118/400; 205/125

(56) References Cited

U.S. PATENT DOCUMENTS

| | | | | |
|---|---|---|---|---|
| 4,000,045 A | * | 12/1976 | Rotzow | .................... 205/125 |
| 4,315,985 A | * | 2/1982 | Castellani et al. | .......... 430/314 |
| 5,068,013 A | * | 11/1991 | Bernards et al. | ............. 205/125 |
| 5,744,019 A | * | 4/1998 | Ang | ........................... 205/96 |

* cited by examiner

Primary Examiner—Nam Nguyen
Assistant Examiner—Wesley A. Nicolas
(74) Attorney, Agent, or Firm—John M. Gunther; Krishnendu Gupta (57) ABSTRACT

There is disclosed an improved apparatus for manufacturing printed circuit boards which solves the problem of immersion bath contaminants being plated-out onto electrically-conductive, circuit functional pads, (board-features) by introducing into the bath system a mechanism for attracting those contaminants to non-functional "micro-thieves" which are electrically-conductive, non-circuit-functional pads having substantially smaller dimensions than those of the smallest board-feature, thereby taking advantage of previously unknown immersion bath uncontrolled strike phenomena, whereby the contaminants are directed to the micro-thieves and away from the board-features. Application of the micro-thieves in the immersion bath environment also produces plated features, of both finer and larger geometries, having flatter surfaces and a more uniform plated thickness for all features on the printed circuit board (PCB), than previously obtained.

6 Claims, 4 Drawing Sheets

APPARATUS FOR MANUFACTURING PCB'S

This is a divisional patent application (and claims the benefit of priority under 35 USC 120) of U.S. patent application Ser. No. 09/536,195 filed Mar. 27, 2000 and now U.S. Pat. No. 6,398,935.

BACKGROUND OF THE INVENTION

1. Field of the Invention

The present invention relates to improvements in a process for manufacturing electrical or electronic printed circuit boards (pcb's) used in various electrical apparatus such as, for example, computer equipment including storage and systems. More particularly, the present invention relates to improved methodology and apparatus incorporated into such process employing at least one immersion bath, to reduce the number of pcb failures otherwise derived from failed deposition interfaces.

2. Description of Prior Art (A) Printed Circuit Board Manufacture:

Printed circuit boards have been in use for many years. They are normally parallel-planed structures having conductive planes alternating with insulating planes. Certain of the internal conductive planes can be used as electrical shields being connected to ground, and other of the internal planes as well as the two external planes on either side of the board are generally used for conducting electrical signals for the purpose of achieving a useful result.

These multilayered boards are manufactured by using sheets of solid FR-4 epoxy laminate with copper foil bonded to the laminate. Conductive patterns are etched in the sheets of copper which are placed between what is called B stage (partially cured) green epoxy sheets. Some fourteen or sixteen sheets are thus sandwiched and are referred to as a "book" which gets laminated in a press with heat, pressure, and vacuum applied. The result is a solid sheet of epoxy laminate with layers of copper patterns trapped inside. Copper is pre-bonded onto the outside of these panels as noted above. Holes known as "vias" or "interstitial interconnects" are then drilled where needed. The cylindrical wall of the hole is thus made from alternating rings of FR-4 and copper. If a connection to a particular inner copper plane is needed, that copper ring is part of the hole wall. If a connection to another copper plane is not needed, then that copper ring is not part of the hole wall because that copper plane at that hole location would have earlier been concentrically pre-etched to a larger diameter during inner layer manufacture (the resultant disconnect being called an "antipad").

Figure 1:
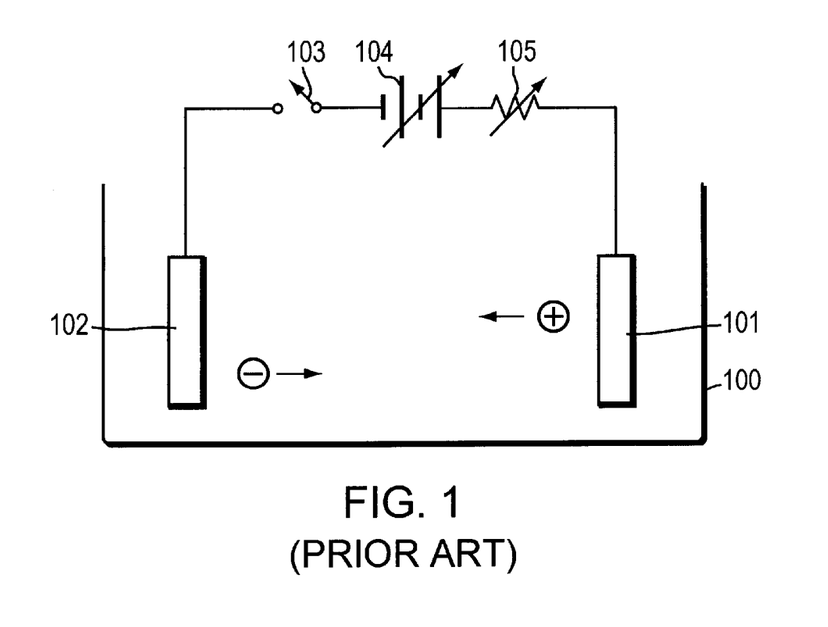
FIG. 1 is a schematic diagram of an anodic bath showing material to be plated and plating material connected in an externally-powered electrical circuit.
Figure 2:
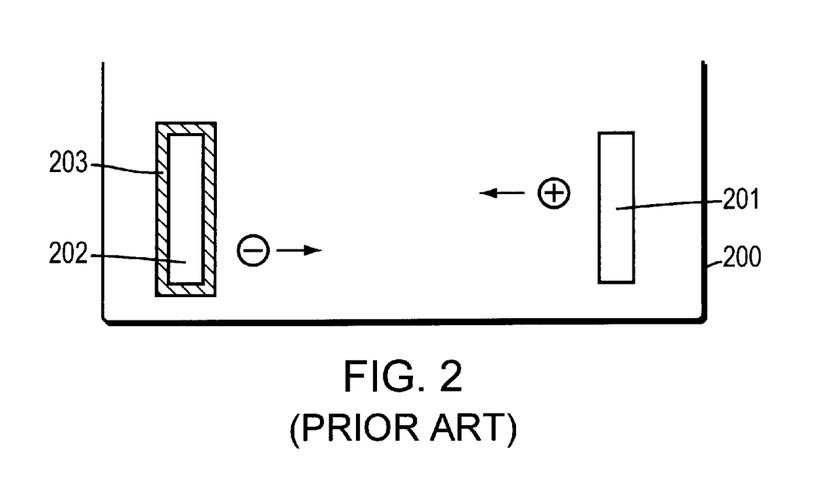
FIG. 2 is a schematic diagram of an immersion bath showing material to be plated and plating material connected only by way of ionization flow between them and not by way of any externally-powered electrical circuit.

To get copper into the hole properly, the hole has to first be de-smeared, a process which gets rid of the resin in the hole which is a by product of the drilling operation. Friction causes some of the resin to melt and smear over the copper rings. Typically one uses a permanganate solution in the desmearing process which eats away resinous materials. The permanganate is then cleaned out of the hole with hot water rinse. Thereafter the hole is catalysed by seeding the exposed copper rings with negative ions using, for example, palladium-chloride. Next, the board is inserted into a copper immersion bath shown schematically in FIG. 2. Bath container 200 holds copper solution (not shown). Printed circuit board 202 is coated with negatively catalyzed palladium-chloride 203 which attracts positive ions to its surface as shown. The hole wall (not shown in FIG. 2) is thus plated to a copper thickness of approximately 30 microinches thereby conductively connecting certain inner copper planes. In the next step, and, referring to FIG. 1, anodic or galvanic plating bath 101 is used with external dc current applied through variable power source 104, variable resistance 105 and switch 103 (when closed) to drive copper metal out of immersed copper bar 101 into solution, and by electrolysis quickly build a layer of deposited copper onto all exposed copper surfaces of immersed board 102 including the hole wall surface (not shown). This copper deposition is usually allowed to build to three mils thick (diametrically).

Thereafter the external copper planes are etched into the conductive pattern desired using photomasks to protect the required copper circuitry from acid etchants, in a complex procedure familiar to practitioners in this art. Although such procedure will not be discussed in detail, reference is hereby made to copper thieves 305 of FIG. 3. These electrically-conductive (but otherwise electrically-isolated) pads, or "thieves", which are not functionally connected to the electrical signal paths of the etched pcb, have been regularly employed to attract copper to them, but only during the anodic or galvanic externally-powered plating process described in FIG. 1. The purpose of these thieves is to "steal" or attract copper ions away from the functionally conductive features or pads for the purpose of effecting uniform plating, during the galvanic process, of the plateable areas over the pcb in general. Accordingly, the surface areas of each of the functional pads achieves generally well-balanced plating thicknesses in the anodic environment. Finally, the etched pcb with exposed copper conductive pads is protected by depositing either solder or nickel onto the exposed copper, which enhances its shelf life immensely. If nickel is used, the nickel is then immediately preserved by depositing gold thereon. Solutions to problems associated with these solder or nickel/gold deposition procedures are the subject of the preferred embodiment of the present invention discussed hereinbelow.

(B) Problems of Manufacture—Contaminants:

Although pcb's have been in use for some time, the design and manufacture of these boards are still complex and challenging tasks and there still are problems of manufacture to be addressed and overcome. One of the problems to be overcome derives from short "shelf-life" of some of the materials used in manufacture such as copper and nickel, which quickly oxidize if not properly protected. Oxidized surfaces can create manufacturing problems. As an example, consider copper, which is widely used as an electrical conductor. If one observes fresh copper foil coming out of a plating bath it is a very bright, vivid, pink-orange color. Within a short time, perhaps an hour, its color turns toward a chocolate brown as a result of oxidation. Copper takes oxides quickly, i.e., it absorbs moisture because it is porous; thus it tarnishes and forms the oxide layer which is still electrically conductive but is resistant to metallurgical wetting and therefore to the soldering process, and one therefore cannot readily solder to copper-oxide. The longer copper is left untreated, even for a few weeks, the more aggressive an acid flux is needed to remove the oxide in order to accomplish good solderability. There is a similar oxidation problem with the other metal, nickel.

The solution usually applied to this oxidation problem involves rapid coating of the metal with a protective shield to prevent oxidation. If copper has not oxidized, it forms a uniform intermetallic bond or interface with solder (formed from a combination of tin and lead). Thus solder can be a protective shield for copper. Otherwise, the oxide repels the solder so that it beads up and de-wets (as noted above), like water beading up on a waxed surface. Likewise, with nickel, typically one applies "flash gold" to the surface of un-oxidized nickel to prevent the nickel from oxidizing. The gold layer is typically very thin, perhaps in the range of two-ten microinches, and is sacrificed later when solder is applied to the gold-nickel bond. The gold is removed by the soldering process, is dispersed within the solder joint, and the solder is deposited directly against the nickel, again forming an excellent intermetallic bond because of the lack of oxides/impurities on the previously-protected nickel surface.

Other problems of pcb manufacture are derived from operation of the chemical baths in which plating of exposed conductive electrical surfaces on the pcb's is accomplished. As earlier noted, there are at least two kinds of chemical baths used: (1) anodic or galvanic baths—the kind that uses external electrical energy such as a source of dc power to cause a plating result; and, (2) immersion baths—the kind that does not use any external electrical energy to cause a plating result and which relies only on naturally-occurring ionization in the bath to cause the plating, (both discussed in more detail below). These problems are due to contaminants in the bath solution forming on the surface of the plated material and preventing a good metal-to-metal bond or deposition-interface. These contaminants may be derived from the oxides mentioned above as well as from organic materials in the bath.

For example, when nickel is being plated to copper, as the nickel ions come out of solution at the time of their being deposited onto the copper, the complex molecules in which they were transported in solution are broken down into organic compounds not unlike shellac-like materials, (carbon-based, or other compounds), as by-products which remain in solution and form contaminants. The organic chemistry of the bath solution can thus be quite complex. (In the "old-days" practitioners were said to have thrown foreign matter such as "tallow" and scraps of leather into the bath to help form complex organic chains to promote plating—a black art, although this practice is not carried-on today.) In any case, these contaminants can get deposited on the copper surface under the nickel and affect metal-to-metal adhesion.

For another example, consider gold being plated onto nickel where the boards come out of the bath showing the gold looking quite bright. However, after soldering is undertaken there can be one isolated feature or conductive pad that turns black because there is organic contaminant material between the gold and the nickel. This prevents "wetting" of the solder to the nickel surface because the metal has been oxidized and, as noted, solder cannot flow properly to oxidized metals. Typically, one might get this bad result on pcb's in isolated locations, with no pattern of failure that can be ascertained. This makes the problem quite frustrating since, prior to the soldering step, the deposited joints looked as if they were formed properly. The organic contaminant material chars the nickel surface and this failure mode is termed "black gold". Virtually all nickel and gold immersion bath manufacturers produce baths in which this problem arises on pcb's subjected to those baths.

Adding further to the contaminant problem in the immersion bath arena is the catalytic agent needed on the material to be plated. In other words, because there is no external electrical power in an immersion bath, the copper surface to be plated has to be first catalyzed with negative ions so that when placed in the nickel bath, the nickel ions will be attracted to the negatively charged copper surface. Thus, the catalytic agent (sometimes palladium-chloride) comes into solution, chemically reacts therein, and aids in the formation of contaminants.

In summary, contamination problems can be derived from at least the following: oxidation, organics, foreign substances in the bath, and/or catalytic agents. And any one of these contaminants taken either alone or in combination with any of the other contaminants can cause pcb manufacturing problems.

These contaminants are sometimes filtered out, which is a prior art solution to the problem, but such filtration is not perfect. If unfiltered or otherwise remaining in solution contaminants may be transferred onto conductive electrical surfaces of the pcb, thus preventing formation of a good intermetallic bond as these organics and other contaminants, are plated-over, later resulting in a failed pcb under test as described above. Often there is not enough contamination to even characterize it, perhaps only three or four angstroms of contaminant transferred during plating, but still enough to cause a bonding problem. This is a long-standing and tricky problem to solve on the molecular scale in which it presents itself, and which has plagued the pcb manufacturing industry over the years. What complicates the matter even further is that different bath manufacturers typically use different bath solution chemistry whereby the organic and inorganic contaminants can vary widely from bath to bath, making specific chemical solutions to the problem complex and difficult to achieve.

(C) Problems of Manufacture—Surface Flatness/Thickness Uniformity

A separate problem in pcb manufacture relates to the need for flatness of surface or uniformity of thickness of the plated features and to the need for uniform thickness of the cylindrically-shaped, plated hole walls bounding the vias or holes in the pcb's. As mentioned above copper thieves are and have been employed with anodic baths exclusively, for the purpose of enhancing general uniformity of plating across the pcb. However, in addition to the issue of general uniformity of plating across the pcb, one needs to also be concerned about extreme flatness of plating across each individual feature or tab, on a pad-by-pad basis. A flat feature is known in the industry as a "coplanar feature".

The assignee of this patent and others in the industry oftentimes employ very fine-featured component geometries on their pcb's. Those fine features, which need to be protected from oxidation, also need to be very flat and very solderable so that electrical/electronic components or parts or chips to be soldered thereto will not skid off those fine features during the soldering step in the manufacturing process. As earlier noted, solder is sometimes applied to the copper foil in an early pre-manufacture stage of pcb manufacture, primarily for purposes of oxidation-protection. Although this is effective protection against oxidation, this early solder application tends to negate the extreme surface flatness of these fine-featured and other solderable components thus creating problems including component-mounting problems later on in the process. Conventional pcb finishes employ the addition of molten solder through equipment known as "Hot Air Solder Leveling (HASL) equipment" which, for example, may tend to apply excessive amounts of solder to fine pitch component pads and, in combination with the hot air application which blows on and tends to move the molten solder, can create fine-featured solderable surfaces that are "crowned" and not flat and, therefore, from which components can skid when they are in the process of being mounted and soldered.

As an alternative to the HASL application of solder, oxidation protection by way of a plating process is available. However, since the pcb at this stage of the manufacturing process contains electrically-disconnected surfaces, one from the other, an anodic bath is not feasible (all surfaces would not be at the same potential since they are no longer conductively connected). At this stage in the pcb manufacturing process, the only available plating process is by way of an immersion bath, where no external potential is applied and where all conductive surfaces on the pcb to be plated have the same electrical status. This immersion bath process was discussed earlier in which nickel-gold was deposited over copper as an oxidation protector. Although the immersion bath process is relatively good from the feature-flatness viewpoint, it isn't perfect because the centers of the features to be plated tend to plate more thickly than the corners or edges of those features. Thus there isn't a perfect flatness of feature or uniformity of thickness surface resulting from plating with immersion baths. The larger mass at the center of the feature tends to attract more ions than the smaller feature-mass near its edges/corners. Thus, in an immersion bath, the center area of a given feature plates-up faster and more than its edges/corners which therefore become relatively-thinly plated which can cause significant problems.

Plated features with edges/corners that are relatively thin for reasons noted above may have a tendency to crack for a variety of reasons including thermal stress. Obviously this is a problem. Stress cracks propagate between the nickel and copper and cause electrical dis-continuity. Or, if more porous at the thinner-plated edges, a given feature is more likely to allow an oxide through to interfere with the metal bond creating an adhesion problem which impacts reliability of any nickel-gold bonding, as well as solder applied thereto.

The present invention is a breakthrough-discovery which addresses the above-noted contamination problem with a direct and effective solution which allows pcb's manufactured in accordance with the present invention to have markedly lower failure rates due to experiencing far-fewer failures resulting from contaminant buildup on deposition-interfaces than what was previously experienced The present invention also offers a direct and effective solution to this non-uniformity of feature-surface problem.

SUMMARY OF THE INVENTION

The present invention relates to a method employing an immersion bath for reducing deposition-interface failure in the manufacture of a pcb. The size of the smallest of the electrically-conductive, circuit-functional pads is measured. There is distributed on the surface of the pcb a plurality of micro-thieve pads each being substantially smaller than the smallest sized functional pad. The pcb's are subjected to an immersion bath and contaminants in the bath are deposited onto micro-thieve pads (which are not otherwise electrically functional) and not onto the functional pads, thus permitting successful deposition onto the functional pads resulting in a good intermetallic bonding or deposition-interface.

In a further feature of the present invention, the distribution of the micro-thieve pads is performed under computer control in accordance with a specific algorithm that makes the pattern of micro-thieve pads complementary to the distribution pattern of functional pads.

In yet a further feature of the present invention, the functional pads are either: (1) exposed copper, or (2) gold deposited over nickel deposited over copper, and the pcb's are multilayered. In a particular design, each micro-thieve pad can be less than 81 square mils (one mil is 1/1000 inches).

In another aspect, the present invention relates to apparatus for reducing pcb failures due to contamination build up on plated surfaces in an immersion bath, which apparatus utilizes a plurality of micro-thieve pads distributed on the pcb, each pad being substantially smaller than the smallest of the functional surfaces being plated, and each pad being designed to attract contaminant contained in solution of the immersion bath, thereby avoiding contaminant buildup on the plated surfaces.

In yet another aspect, the present invention relates to micro-thieve apparatus and methodology for use with an immersion bath process of pcb manufacture for the purpose of enhancing flatness of plating or uniformity of thickness of each pcb-feature by effecting uniform plating across the pcb.

In still yet another aspect, the present invention relates to micro-thieve apparatus for use with an immersion bath process of pcb manufacture for the dual purposes of both reducing deposition-interface failures due to contamination contained in solution of the immersion bath while enhancing flatness of plating of each pcb-feature by effecting uniform plating across the pcb.

It is thus advantageous to employ the present invention in the manufacture of pcb's since reliability, quality, and bond strength of the deposition-interfaces all are enhanced and improved, whereby manufacturing-yield is increased, costs are decreased and the overall cost to users of electrical and computer equipment utilizing these pcb's is decreased.

It is thus a general object of the present invention to provide improved pcb's for use in electrical and electronic circuits and systems including computer-related equipment.

It is another object of the present invention to provide apparatus and method for removing contaminants that would otherwise be plated onto conductive surfaces of pcb's, thereby destroying their utility.

It is yet another object of the present invention to provide within the environment of an immersion bath, means and methodology for attracting contaminants away from functional surfaces on the pcb intended to be plated in that bath and for directing them towards non-functional micro-thieves intended to be sacrificed for this purpose of contaminant-attraction.

It is a further object of the present invention to provide within the environment of an immersion bath, means and methodology for encouraging flatness of plating of each feature on the pcb by effecting uniformity of plating across the pcb.

It is yet a further object of the present invention to provide within the environment of an immersion bath, means and methodology for simultaneously reducing negative effects of bath contaminant upon deposition surfaces while encouraging flatness of plating of each feature on the pcb by effecting uniformity of plating across the pcb.

Other objects and advantages of the present invention will be understood after referring to the detailed description of the preferred embodiments and to the appended drawings wherein:

DESCRIPTION OF THE PREFERRED EMBODIMENTS

Figure 3:
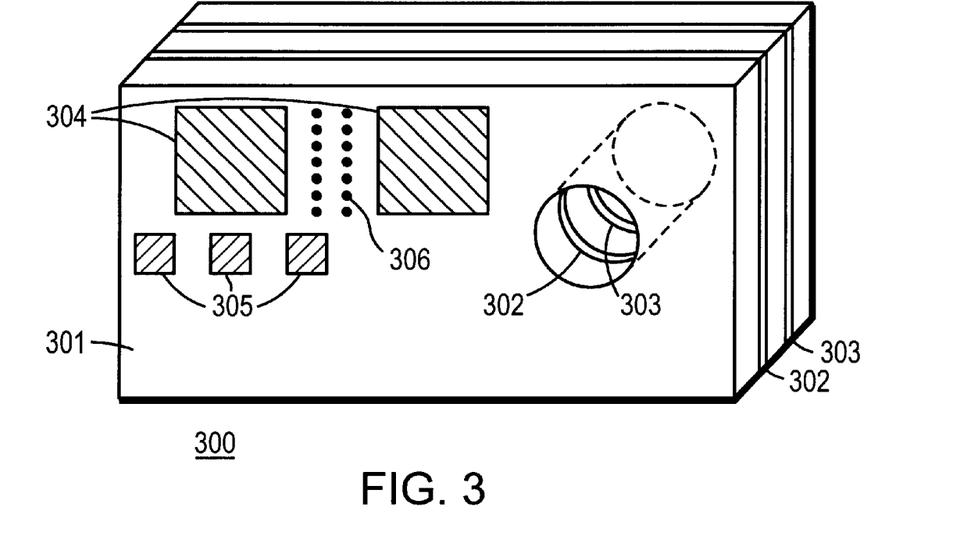
FIG. 3 is a schematic view of a multi-layered printed circuit board (pcb) incorporating aspects of the present invention and showing surfaces to be plated, a distribution of micro-thieves, and an aperture or via formed by drilling a hole through the multi-layers.
Figure 6:
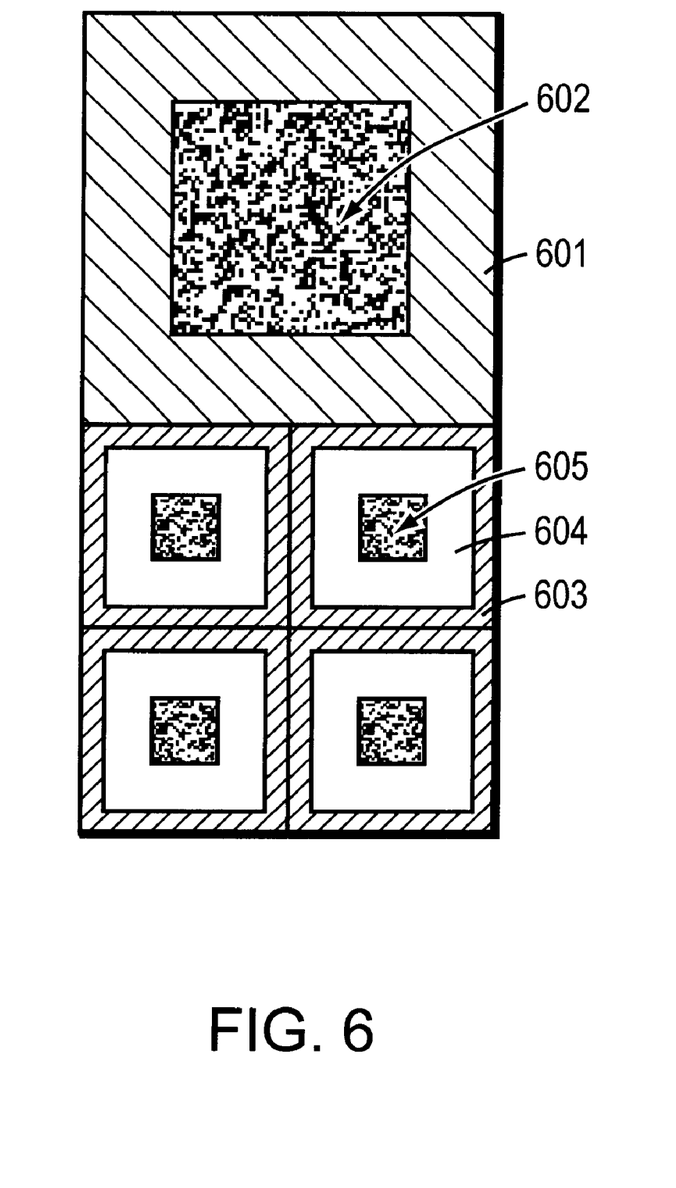

Consider a finished printed circuit board (pcb) as, for example, shown schematically in FIG. 3 as pcb 300. This pcb is shown to contain at least two inner conductive planes 302 and 303, preferably made of copper foil. Surface 301 is made of fiberglass epoxy known as FR-4 epoxy and holds a plurality of electrically-conductive, circuit-functional pads or features 304, also made of copper. In addition there are other pluralities of both copper thieves 305 and micro-thieves 306 distributed over surface 300 in specific patterns designed so that they do not interfere with each other nor with functional operation of the pads (these thieves and micro-thieves will be discussed in more detail hereinbelow). These pads were formed from copper foil pre-bonded to surface 301, where areas of conductivity in that copper foil which were not needed to meet connectivity requirements of this pcb were removed by an etching process. In addition, there is an aperture in pcb 300 exposing arcuate edges of inner conductive planes 302 and 303. It is to be understood that this is a schematic presentation, not drawn to scale, and in reality any pcb would have a huge number of pads, thieves, and micro-thieves and perhaps fourteen or more inner conductive planes, and that FIG. 3 is in simplified schematic form for purposes of enhancing clarity of presentation The preferred embodiment of the present invention includes micro-thieves 306 of FIG. 3 in combination with an immersion bath procedure. The micro-thieves are very small copper thieves which are deployed in a pattern across the surface of the pcb under computer control in accordance with an algorithm which takes into account the precise circuit layout on that particular pcb and the relative location of its micro-thieve features. Referring to FIG. 6, copper thief 602 (being the equivalent of copper thief 305 of FIG. 3) is shown in juxtaposition to four micro-thieves 605 (being the equivalent of micro-thieves 306 of FIG. 3) in an area ratio that is reflective of the ratio that is actually used. Typically, copper thief 602 can be a 30 mil square on a 50 mil grid, LPI (liquid-photo-imageable) covered Micro-thieve 605 is a copper target being typically 9 mils on edge positioned within a 19 mil square opening 604 centrally located in an LPI photomask aperture 603 of 25 mils on edge. It should be understood that these micro-thieves and the copper thief shown in FIG. 6 are not necessarily juxtaposed in this very pattern across the entire surface of the pcb without variation; the precise juxtaposition shown is made for clarity of presentation. Varying or irregular patterns can be employed. Further, the micro-thieves need not be squares, but can have any desired geometrical shape capable of being manufactured.

The constraint that the present invention necessarily includes usage of an immersion bath addresses the contamination-failure mechanism inherent in the immersion bath. However, to understand this mechanism, it is useful to consider operation of the anodic bath wherein a "strike" is used. The strike is total amount of energy, power, or current needed to get the electrolytic process to start, in comparison with a different amount of steady state level of energy, power, or current to achieve optimum plating over a finite period of time. In other words, an energy threshold has to be exceeded first before the process can go forward and be sustained at that different threshold. For example, the strike could be about 8 amps and the steady state level about 12 amps in some pcb anodic electro-plating operations.

By contrast, in the immersion process, the resultant ionized surface energy drives the initiation of plating at the workpiece surface. That process eventually begins at the time of occurrence of the immersion bath's version of an "uncontrolled strike phenomena", whereupon attraction of positive ions to the negatively catalyzed feature-surface causes the deposition process to begin immediately thereafter, and whereupon the contaminant-generation process begins last. There is a very short time, on the order of milliseconds, from beginning of ionization to generation of contaminants, a vulnerable time. In the immersion bath, however, with the uncontrolled strike phenomena, the ionization mechanism is such that the buildup of potential in the bath prior to ionization causes the first ions produced to be attracted to the largest surfaces to be plated, which surfaces later turn out to be almost always contaminant-free. The smaller surfaces to be plated then attract ions along with contaminant in solution. These smaller surfaces are where contaminant-induced deposition-interface failure is more likely to be found since the delay in plating gave opportunity for the natural organics/inorganics (including by-product of the negative ion catalyst) to settle on the smaller surfaces which were to be properly plated and soldered-to later on. The solution offered by the present invention is based on the discovery of this uncontrolled strike phenomena in the immersion bath and takes advantage of this phenomena to draw contaminant away from all of the electrically-conductive, circuit-functional features/pads and towards and to the microthieves which are non-functional and therefore purposely sacrificed to this contaminant.

More specifically, the micro-thieves are designed to be the smallest plateable features on the pcb, and as noted above are 81 square mils; rounding of the square corners due to the etching process shall reduce this area somewhat. (This dimension could be reduced, if need be, to the currently available minimum feature size today of approximately three mils per side and can be further reduced as technological capabilities progress). The result obtained from application of the present invention to this problem was that almost any electrically-conductive, circuit-functional feature, including those which were not the largest on the pcb but which were substantially larger than the microthieves, were going to be plated initially and well prior to the onset of plating upon the micro-thieves. This enabled the contaminant in solution to remain therein sufficiently long to be "swept" to the micro-thieves along with the micro-thieve plating action.

Figure 4:
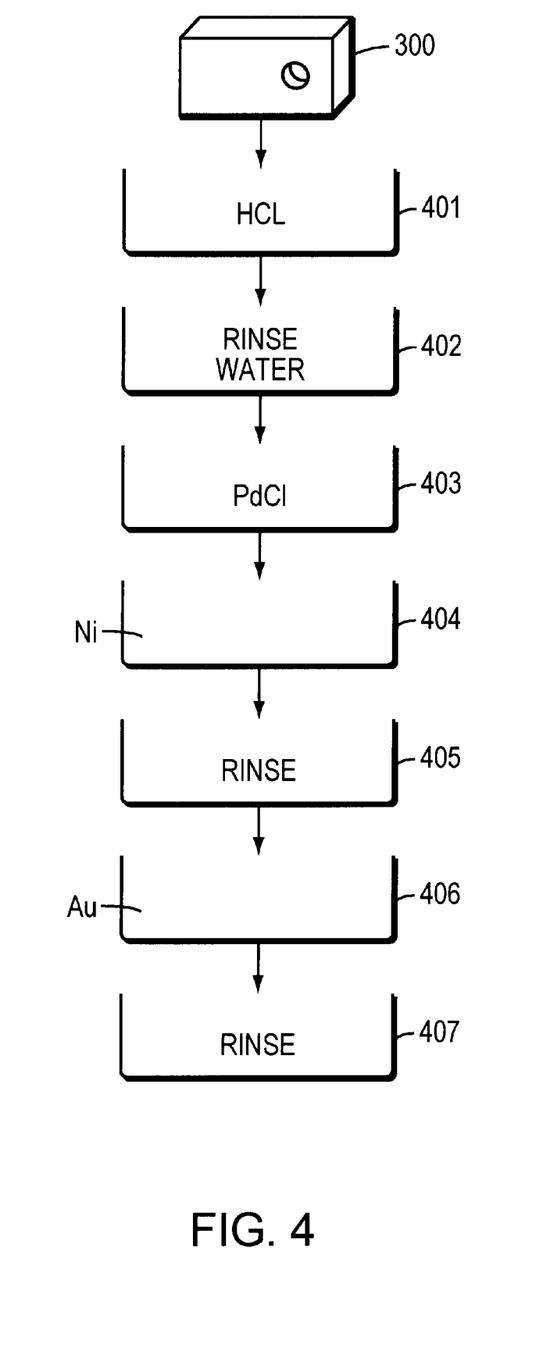
FIG. 4 is a schematic view of movement of the pcb of FIG. 3 through various baths accordance with aspects of the present invention.

Refer next to FIG. 4, a schematic diagram of how a pcb containing the microthieves would be treated in the foregoing process. Initially, and prior to introduction into the process depicted in FIG. 4, pcb 300 had been copper plated in an immersion bath to a depth typically of 30 millionths of an inch maximum and thereafter copper plated in an anode bath to a depth of approximately 3.0 mils of copper, as earlier described, allowing plating through of the holes, etc. Assuming that the copper was not immediately protected, it then appears at the top of FIG. 4 with some copper oxide thereon and is initially dipped into an acid bath (microclean) 401 to remove the oxide. From there it is rinsed in step 402 and proceeds into catalytic bath 403 to be seeded with palladium-chloride, a negatively charged material. After that, it is dipped into a nickel-immersion bath 404, which allows nickel to be plated onto the pcb in the manner described in the preceding paragraph, with contaminants flowing to micro-thieves in accordance with operation of the present invention. Then the nickel plated board is rinsed in hot water in step 405 and thereafter is inserted into gold-immersion bath 406 where gold is deposited on top of nickel, again proceeding in accordance with the description above on operation of the present invention providing protection afforded by micro-thieves in the context of an immersion bath environment. Finally, the gold-plated pcb is rinsed in step 407.

As earlier noted, usage of micro-thieves in the immersion bath process results in an improvement in evenness of plated finish. Such usage has offered the opportunity to make measurements and produce data which support the conclusion: micro-thieves contribute materially to a marked improvement in evenness of plated finish (resulting flatness of deposition surfaces) on a feature-by-feature basis over the entire pcb. This unexpected and breakthrough discovery is counterintuitive. Prior usage of copper thieves was experienced only in anodic baths in which one relied on a theory of large copper thieves drawing copper away from smaller functional-features to enable smooth plating. By contrast, these micro-thieves, barely visible to the naked eye, when taken collectively in their multitudes, in addition to drawing contaminants to their individual, microscopic, and sacrificial bodies in accordance with a first phenomena, also cooperatively and synergistically draw immersion plated metals to themselves in a macroscopic manner to enhance functional feature flatness in accordance with a second phenomena and plating theory thereof not yet fully understood, but the effects of which have been clearly measured.

Figure 5:
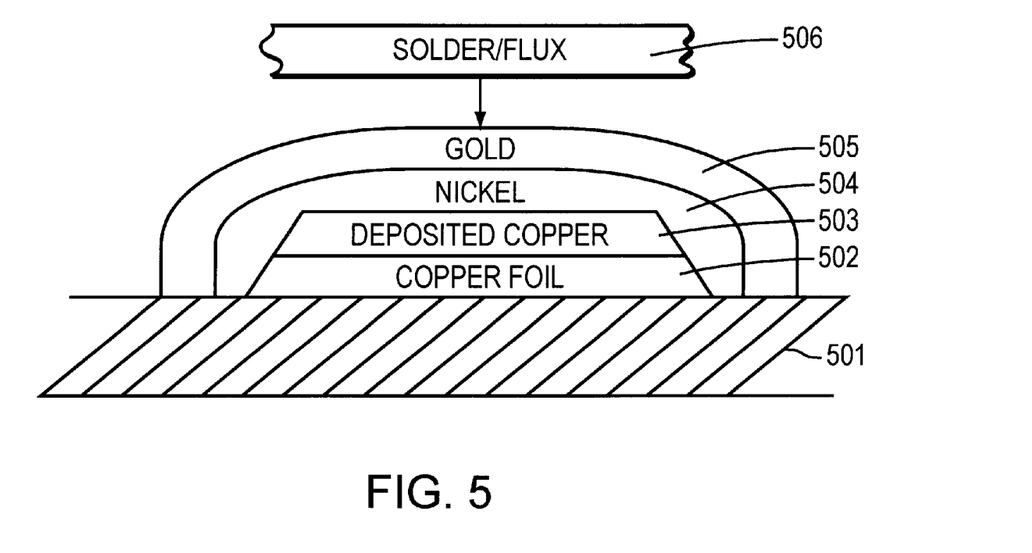
FIG. 5 is a cross sectional view of the build-up of deposited materials in accordance with aspects of the present invention; and, FIG. 6 is a plan view of micro-thieves juxtaposed with a larger, singular thief.

A cross-section of each feature on the pcb, whether large or small is shown in FIG. 5. In accordance with the methodology of FIG. 4, just discussed, epoxy laminate 501 receives bonded copper foil 502. Copper 503 is deposited in two steps as noted above. Then nickel 504 is plated over the copper and gold 505 is plated over the nickel. At this stage, the pcb will not tarnish and will have a shelf life of several years. If solder/flux 506 is applied to the gold surface, it melts away and is carried-off in the solder and flux; the solder is then deposited directly onto the nickel. The immersion bath action in combination with use of the present invention permit extreme flatness of plated features, as shown in FIG. 5., thereby permitting excellent solderability and resulting in higher assembly yields and reliability, provided, however that the contaminant problem (a solution thereto being also provided by the present invention) is overcome.

An area of dramatic improvement in flatness as a result of application of micro-thieve patterns in an immersion plating environment has been observed in the hole-walls of the plated vias, irrespective of via diameter. A hole-wall nickel-thickness variation-ratio of approximately 6:1 has been reduced to approximately 2:1 by application of the present invention. This improved uniformity of hole-wall nickel thickness is very important in relation to the soldering step. Further, in thermal stress test situations, where the pcb including these vias (copper/nickel cylinders) are expanded and contracted rapidly, areas of thin cylinder walls are likely to crack and fail.

In all of the foregoing description of the preferred embodiment of the invention, the micro-thieves were interacting with the immersion bath action in a manner to permit deposits of uncontaminated metal ions directly to all features substantially larger than each of those features comprising the plurality or pattern of micro-thieves. It should be understood, however, that effective operation of the present invention in terms of its impact in both removing low-level organic and other contaminants (a by-product of the immersion plating environment) and providing a more even-plated metal thickness throughout the pcb in such environment, is dependent upon these immersion baths being operated within their correct operating parameters. Use of the present invention does not protect plated surfaces from catastrophic plating failures which are the direct outcome of mis-operation of immersion baths or from using improperly-cleaned baths having unacceptably high levels of metallic or organic contamination.

There are other immersion plating systems in the electronics industry which are alternates for nickel-gold systems. None of the other systems are currently as popular as nickel-gold, but all can give a coplanar solderable surface under appropriate conditions of manufacture, with reasonably long shelf life. These are (1) immersion palladium; (2) immersion palladium with ruthenium catalyst; (3) immersion silver; (4) immersion tin. Any of these systems and others would benefit from application of the present invention.

Furthermore, the foregoing process for pcb manufacture was a "subtractive" process; i.e.: solid sheets of copper foil were imaged and etched, thus subtracting copper to represent air space between conductors. By contrast, other companies may use an "additive" process, where sheet epoxy laminate is covered with film resist which is exposed and developed leaving bare laminate where conductive circuitry is required. The laminate is then catalyzed (using palladium-chloride or equivalent), and is applied to seed the conductor area.

The resist is then stripped and the copper conductors plated up with a more aggressive immersion bath (thus an additive process). The present invention would be equally applicable and beneficial in this context.

The present embodiments are to be thus considered in all respects as illustrative and not restrictive. For another example, consider application of the present invention to the area of plating of gold bond pads involving a Bt (bismaleimide triazine) substrate (sometimes called FR-5). This occurs in the area of packaging die in Plastic Ball Grid Array Packages. Positive results would be expected from use of the present invention in this arena too. And there may be other applications for the present invention as well. Therefore, the scope of the invention is indicated by the appended claims rather than by the foregoing description, and all changes which come within the meaning and range of equivalency of the claims are therefore intended to be embraced therein.

What is claimed is:

1. Apparatus for reducing deposition-interface failure in the process of manufacturing electrical printed circuit boards, said process employing immersion-bath techniques and said boards supporting distributions of multi-sized, electrically-conductive, circuit-functional pads, said apparatus comprising:

a plurality of electrically-conductive, non-circuit-functional, micro-thieve pads, each being substantially smaller than the smallest of said circuit-functional pads, arranged in one or more distribution patterns on the surfaces of said boards and juxtaposed said circuit-functional pads to complement said distributions thereof, said apparatus being operational during application of said techniques.

2. The apparatus of claim 1 and wherein said micro-thieve pads are no greater than 81 square mils.

3. The apparatus of claim 1 and wherein at least some of said micro-thieve pads have a non-square geometry.

4. The apparatus of claim 1 and wherein at least some said one or more distribution patterns are regular patterns.

5. The apparatus of claim 1 and wherein at least some of said one or more distribution patterns are irregular patterns.

6. Apparatus for both reducing deposition-interface failure and enhancing plating flatness of plateable features in the process of manufacturing electrical printed circuit boards, said process employing immersion-bath techniques and said boards supporting distributions of multi-sized, electrically-conductive, circuit-functional pads, said apparatus comprising;

a plurality of electrically-conductive, non-circuit-functional, micro-thieve pads, each being substantially smaller than the smallest of said circuit-functional pads, arranged in one or more distribution patterns on the surfaces of said boards and juxtaposed said circuit-functional pads to complement said distributions thereof, said apparatus being operational during application of said techniques.

* * * * *